United States Patent
Nakashima

(10) Patent No.: US 6,765,253 B2
(45) Date of Patent: Jul. 20, 2004

(54) SEMICONDUCTOR MEMORY DEVICE

(75) Inventor: Yasushi Nakashima, Hyogo (JP)

(73) Assignee: Renesas Technology, Corp., Tokyo (JP)

( * ) Notice: Subject to any disclaimer, the term of this patent is extended or adjusted under 35 U.S.C. 154(b) by 0 days.

(21) Appl. No.: 10/341,359

(22) Filed: Jan. 14, 2003

(65) Prior Publication Data

US 2004/0036104 A1 Feb. 26, 2004

(30) Foreign Application Priority Data

Aug. 20, 2002 (JP) ........................................ 2002-239357

(51) Int. Cl.[7] ............................................. H01L 29/76
(52) U.S. Cl. ........................ 257/296; 257/303; 257/314
(58) Field of Search ................................. 257/296, 303, 257/314, 393, 903–904, 300, 202; 365/185.08, 185.01, 185.02, 185.13, 170; 438/152, 128, 587, 250

(56) References Cited

U.S. PATENT DOCUMENTS

| 4,549,102 | A | * | 10/1985 | Segawa et al. ................. 326/88 |
| 4,725,985 | A | * | 2/1988 | Ogura et al. .................. 365/201 |
| 4,737,935 | A | * | 4/1988 | Wawersig et al. ........... 365/200 |
| 5,194,749 | A | * | 3/1993 | Meguro et al. ................ 257/69 |
| 5,288,377 | A | * | 2/1994 | Johnson et al. .............. 204/486 |
| 5,327,376 | A | * | 7/1994 | Semi ........................... 365/154 |
| 5,406,107 | A | * | 4/1995 | Yamaguchi .................. 257/393 |
| 5,495,437 | A | * | 2/1996 | Tai et al. ..................... 365/145 |
| 6,130,713 | A | * | 10/2000 | Merrill ........................ 340/308 |
| 6,434,076 | B1 | * | 8/2002 | Andersen et al. ........... 365/222 |
| 6,452,589 | B1 | * | 9/2002 | McKnight .................... 345/205 |
| 2002/0084967 | A1 | * | 7/2002 | Akimoto et al. .............. 345/90 |
| 2002/0186579 | A1 | * | 12/2002 | Yokozeki ..................... 365/154 |
| 2003/0128575 | A1 | * | 7/2003 | Chen ........................... 365/154 |

FOREIGN PATENT DOCUMENTS

| JP | 60-226091 | 11/1985 |
| JP | 5-243528 | 9/1993 |

* cited by examiner

*Primary Examiner*—Long Pham
*Assistant Examiner*—Thao X. Le
(74) *Attorney, Agent, or Firm*—McDermott Will & Emery LLP

(57) ABSTRACT

A state of storage of a memory cell is determined based on the capacitance stored in capacitor, and the memory cell includes a transfer gate transistor, a capacitor and first and second inverters cross coupled with each other. The capacitor has one electrode electrically connected to an output node of the second inverter, and the other electrode is electrically connected to an output node of the first inverter. Thus, a semiconductor memory device that does not require refresh operation can be obtained.

7 Claims, 18 Drawing Sheets

SEMICONDUCTOR MEMORY DEVICE

BACKGROUND OF THE INVENTION

1. Field of the Invention

The present invention relates to a semiconductor memory device and, more specifically, to a semiconductor memory device in which state of storage is determined based on capacitance stored in a capacitor element forming a memory cell.

2. Description of the Background Art

A DRAM (Dynamic Random Access Memory) as a representative example of a semiconductor memory device has been used in various electronic equipment as most suitable for attaining higher degree of integration and larger capacity of semiconductor devices, as the structure of the memory cell itself is simple, that is, the memory cell has one-element type structure (one transistor and one capacitor).

FIG. 30 is a schematic diagram representing a configuration of memory cells arranged in a matrix of rows and columns in a memory cell array of a DRAM.

Referring to FIG. 30, a memory cell 1000 includes an n-channel MOS (Metal Oxide Semiconductor) transistor 1002, and a capacitor 1004. One of source/drain of n-channel MOS transistor 1002 is electrically connected to a bit line 1008, while the other of the source/drain is electrically connected to one electrode of capacitor 1004. The gate of n-channel MOS transistor 1002 is electrically connected to a word line 1006. The other electrode of capacitor 1004 is electrically connected to a cell plate potential 1010.

The n-channel MOS transistor 1002 is driven by word line 1006 that is activated only at the time of data writing and at the time of data reading, and the transistor is turned ON at the time of data writing and data reading only and otherwise kept OFF.

Capacitor 1004 stores binary information "1" or "0" dependent on whether charges are stored or not. A voltage corresponding to the binary information "1" or "0" is applied from bit line 1008 through n-channel MOS transistor 1002 to capacitor 1004, whereby capacitor 1004 is charged/discharged, attaining data writing.

Specifically, when data "1" is to be written, bit line 1008 is precharged to a power supply voltage Vcc, word line 1006 is activated so that n-channel MOS transistor 1002 is turned ON, the power supply voltage Vcc is applied from bit line 1008 through n-channel MOS transistor 1002 to capacitor 1004, and charges are stored in capacitor 1004. The state in which the charges are stored in capacitor 1004 corresponds to the data "1".

When data "0" is to be written, bit line 1008 is precharged to the ground voltage GND, word line 1006 is activated so that n-channel MOS transistor 1002 is turned ON, and charges are discharged from capacitor 1004 through n-channel MOS transistor 1002 to bit line 1008. The state in which charges are not stored in capacitor 1004 corresponds to the stored data "0".

When data is to be read, bit line 1008 is precharged to a voltage Vcc/2 in advance, word line 1006 is activated so that n-channel MOS transistor 1002 is turned ON, and bit line 1008 and capacitor 1004 are conducted. Thus, a slight change in voltage in accordance with the state of storage of capacitor 1004 appears on bit line 1008, and a sense amplifier, not shown, amplifies the slight change in voltage to the voltage Vcc or to the ground voltage GND. The voltage level of bit line 1008 corresponds to the state of the read data.

The data reading operation described above is a destructive reading. Therefore, word line 1006 is again activated while the bit line 1008 is amplified to the voltage Vcc or the ground voltage GND in accordance with the read data, and the capacitor 1004 is re-charged through the similar operation as the data writing operation described above. Thus, the data once destroyed for data reading is recovered to the original state.

In a memory cell of the DRAM, however, charges of the capacitor 1004 that correspond to the stored data leak by some cause or other, and gradually lost. In other words, the stored data is lost with time. Therefore, in the DRAM, before it becomes impossible to detect the change in voltage of bit line 1008 corresponding to the stored data in data reading, a refresh operation is performed, in which the data is once read and written again.

In the DRAM, it is necessary to perform the refresh operation constantly and periodically on every memory cell. Therefore, the DRAM is in this point disadvantageous in view of higher speed of operation and lower power consumption. In order to attain higher speed of operation and lower power consumption, the DRAM is inferior to an SRAM (Static Random Access Memory) that does not require any refresh operation.

SUMMARY OF THE INVENTION

An object of the present invention is to provide a semiconductor memory device that does not require the refresh operation.

According to the present invention, the semiconductor memory device includes a plurality of memory cells arranged in a matrix of rows and columns, and each of the plurality of memory cells has its state of storage determined based on the capacitance stored in a capacitor element. Each of the plurality of memory cells includes a transfer gate transistor, a capacitor element, a first inverter and a second inverter. The transfer gate transistor has a pair of source/drain. The capacitor element has first and second electrodes opposed to each other to allow storage of capacitance, and the first electrode is electrically connected to one of the pair of source/drain. The first inverter has an input node electrically connected to one of the pair of source/drain. The second inverter has an input node electrically connected to an output node of the first inverter, and an output node electrically connected to an input node of the first inverter. The capacitor element has the first electrode electrically connected to the output node of the second inverter, and the second electrode electrically connected to the output node of the first inverter. The state of storage is determined based on the capacitance stored in the capacitor element.

According to the semiconductor memory device of the present invention, in each of the plurality of memory cells arranged in a matrix of rows and columns, the first and second inverters are cross coupled. Further, the first electrode of the capacitor element storing capacitance is electrically connected to the output node of the second inverter, and the second electrode is electrically connected to the output node of the first inverter. Thus, leakage of charges from the capacitor element is compensated for by the cross coupled circuit. As a result, it becomes possible to prevent the state of storage from being lost because of leakage of charges, without necessitating any refresh operation.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described with reference to the figures.

First Embodiment

Figure 1:
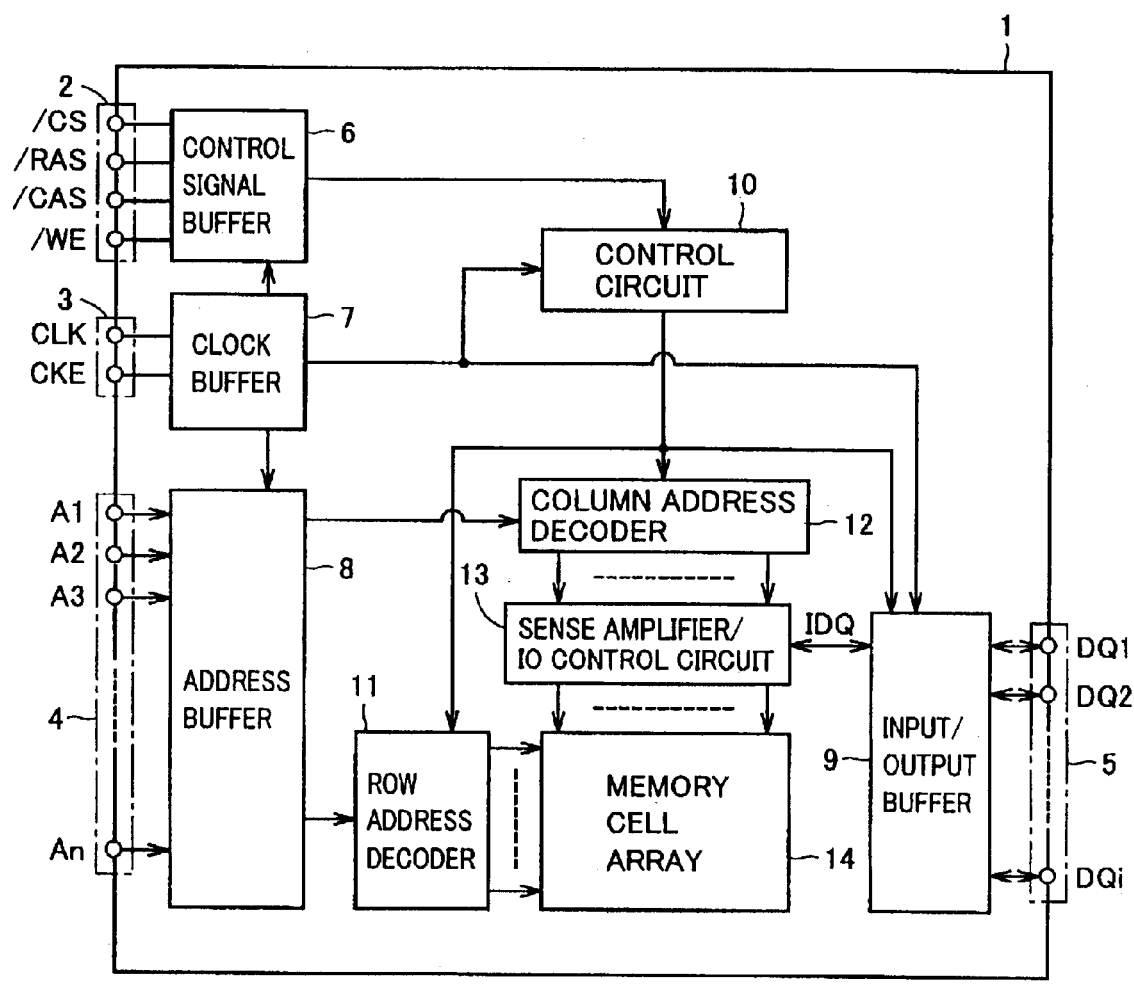
FIG. 1 is a schematic block diagram representing an overall configuration of the semiconductor memory device in accordance with first to third embodiments of the present invention.

Referring to FIG. 1, a semiconductor memory device 1 includes a control signal terminal 2, a clock terminal 3, an address terminal 4, a data input/output terminal 5, a control signal buffer 6, a clock buffer 7, an address buffer 8, an input/output buffer 9, a control circuit 10, a row address decoder 11, a column address decoder 12, a sense amplifier/input-output (10) control circuit 13 and a memory cell array 14.

In FIG. 1, only the main portions related to data input/output are shown as a representative, of the semiconductor memory device 1, and other portions are not shown.

Control signal terminal 2 receives command control signals including a chip select signal/CS, a row address strobe signal/RAS, a column address strobe signal/CAS and a write enable signal/WE. Clock terminal 3 receives an external clock CLK and a clock enable signal CKE. Address terminal 4 receives address signals A1 to An (n is a natural number).

Clock buffer 7 receives the external clock CLK, and generates an internal clock which is output to control signal buffer 6, address buffer 8, input/output buffer 9 and control circuit 10. Control signal buffer 6 takes and latches chip select signal/CS, row address strobe signal/RAS, column address strobe signal/CAS and write enable signal/WE in response to the internal clock received from clock buffer 7, and outputs these signals to control circuit 10. Address buffer 8 takes and latches address signals A1 to An in response to the internal clock received from clock buffer 7 and generates an internal address signal, which is output to row address decoder 11 and column address decoder 12.

Data input/output terminal 5 is for exchanging data read from /written to the semiconductor memory device 1 with the outside, and it receives externally input data DQ1 to DQi (i is a natural number) at the time of data writing, and externally outputs data DQ1 to DQi at the time of data reading.

Control circuit 10 takes command control signals from control signal buffer 6 in response to the internal clock received from clock buffer 7, and based on the taken command control signals, controls row address decoder 11, column address decoder 12 and input/output buffer 9. Thus, data DQ1 to DQi are written to/read from memory cell array 14.

Input/output buffer 9 takes and latches data DQ1 to DQi in response to the internal clock received from clock buffer 7 and an instruction from control circuit 10, and outputs internal data IDQ to sense amplifier/IO control circuit 13. At the time o date reading, input/output buffer 9 outputs the internal data IDQ received from sense amplifier/IO control circuit 13 to data input/output terminal 6, in response to the internal clock received from clock buffer 7 and instruction from control circuit 10.

Row address decoder 11 selects a word line in memory cell array 14 that corresponds to address signals A1 to An, and activates the selected word line by a word driver (not shown) in accordance with an instruction from control circuit 10. Column address decoder 12 selects a bit line pair in memory cell array 14 that corresponds to the address signals A1 to An, based on an instruction from control circuit 10.

Sense amplifier/IO control circuit 13 precharges, at the time of data writing, the bit line pair selected by column address decoder 12 to the power supply voltage Vcc or the ground voltage GND, in accordance with the logic level of internal data IDQ received from input/output buffer 9. Accordingly, internal data IDQ is written to that memory cell in memory cell array 14 which is electrically connected to the word line activated by row address decoder 11 and to the bit line pair selected by column address decoder 12 and precharged by sense amplifier/IO control circuit 13.

Sense amplifier/IO control circuit 13 precharges, at the time of data reading, the bit line pair selected by column address decoder 12 to the voltage Vcc/2, detects/amplifies a slight change in voltage generated corresponding to the read data of the selected bit line pair to determine the logic level of the read data, and outputs the result to input/output buffer 9.

Memory cell array 14 is a group of storage elements having memory cells, which will be described later, arranged in a matrix of rows and columns, and it is electrically connected to row address decoder 11 through word lines corresponding to respective rows, and electrically connected to sense amplifier/IO control circuit 13 through bit line pairs corresponding to respective columns.

Figure 2:
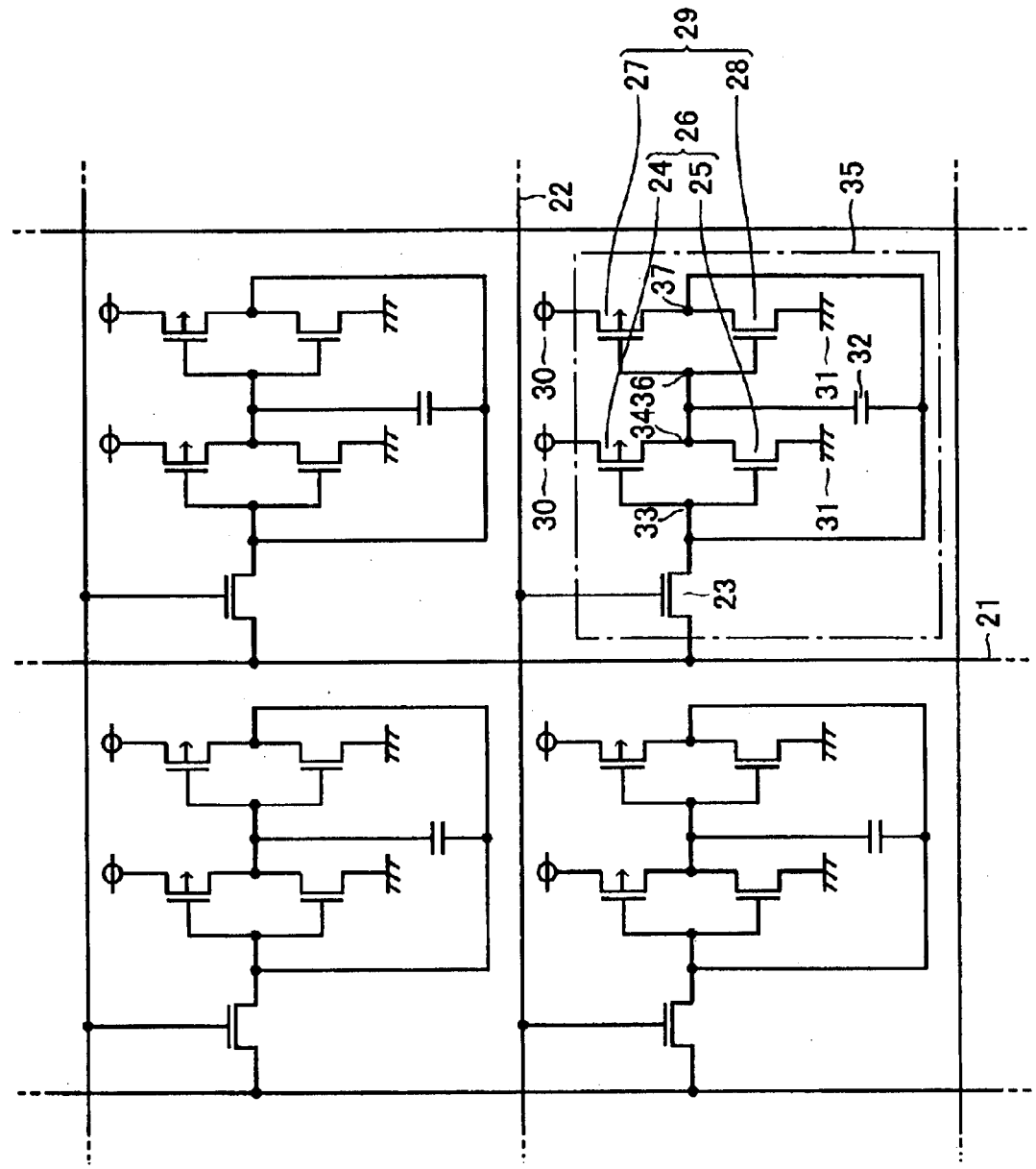
FIG. 2 is a circuit diagram representing a configuration of memory cells arranged in a memory cell array of the semiconductor memory device in accordance with the first embodiment of the present invention.

Referring to FIG. 2, in the memory cell array, the plurality of word lines 22 each extend in the row direction (lateral direction in the figure), the plurality of bit lines 21 each extend in the column direction Longitudinal direction in the figure), and each of the plurality of word lines 22 is arranged to cross each of the plurality of bit lines 21. Here, at an intersection between each of the plurality of word lines 22 and each of a plurality of bit lines 21, a memory cell 35 is arranged, and in this manner, the plurality of memory cells 35 are arranged in a matrix of rows and columns.

Each of the plurality of memory cells 35 includes an n-channel MOS transistor (transfer gate transistor) 23, a capacitor (capacitor element) 32, a first inverter 26 and a second inverter 29. Specifically, memory cell 35 has such a structure that includes first and second inverters 26 and 29 in addition to the memory cell consisting of n-channel MOS transistor 23 and a capacitor 32. The first inverter 26 includes a p-channel MOS transistor 24 and an n-channel MOS transistor 25, while the second inverter 29 includes a p-channel MOS transistor 27 and an n-channel MOS transistor 28.

The n-channel MOS transistor 23 has its gate electrically connected to word line 22, one of source/drain electrically connected to bit line 21 and the other of source/drain electrically connected to capacitor 32. The n-channel MOS transistor 23 is driven by word line 22, which is activated only at the time of data writing and at the time of data reading, and the transistor is turned ON only at the time of data writing and data reading and otherwise kept OFF.

Capacitor 32 has one electrode and the other electrode opposing to each other with a capacitor dielectric posed therebetween. The one electrode is electrically connected to said other one of source/drain of n-channel MOS transistor 23. When a voltage corresponding to the binary information "1" or "0" is applied from bit line 21, the capacitor 32 is charged/discharged, whereby data is written.

In the first inverter 26, p-channel MOS transistor 24 and n-channel MOS transistor 25 are connected in series between a power supply node 30 and a ground node 31, with the connecting portion serving as an output node 34 of first inverter 26. The p-channel MOS transistor 24 and the n-channel MOS transistor 25 have their gates electrically connected to each other, with the connecting portion serving as an input node 33 of the first inverter 26.

In the second inverter 29, p-channel MOS transistor 27 and n-channel MOS transistor 28 are connected in series between power supply node 30 and ground node 31, and the connecting portion serves as an output node 37 of the second inverter 29. The p-channel MOS transistor 27 and the n-channel MOS transistor 28 have their gates electrically connected to each other, with the connecting portion serving as an input node 36 of the first inverter 26.

Input node 33 of first inverter 26 is electrically connected to the output node 37 of the second inverter, and the output node 34 of first inverter 26 is electrically connected to the input node 36 of the second inverter. By such connection, these two inverters 26 and 29 are cross coupled to each other.

It is particularly noted in memory cell 35 of the present invention that one electrode of capacitor 32 is electrically connected to output node 37 of the second inverter 29, and that the other electrode of capacitor 32 is electrically connected to output node 34 of the first inverter 26.

Specific structure of the memory cell array and a memory cell in accordance with the first embodiment will be described in the following.

Figure 3:
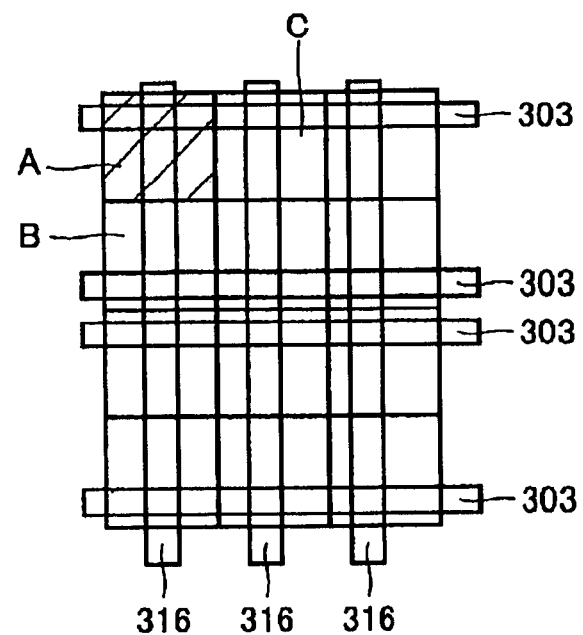
FIG. 3 is a schematic plan view representing a part of the structure of the DRAM memory cell array in accordance with the first embodiment of the present invention.
Figure 4:
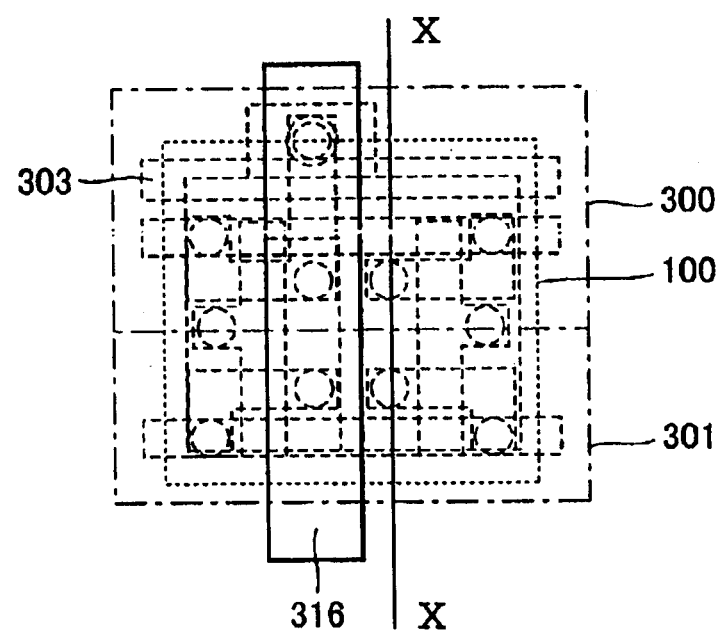
FIG. 4 is a plan view representing a planer layout of unit cell areas A and C shown in FIG. 3.

First, referring to FIG. 3, in the memory cell array, a plurality of word lines 303 and a plurality of bit lines 316 are formed such that each word line orthogonally crosses each bit line. At each intersecting portion between word line 303 and bit line 316, a memory cell is arranged. The hatched portion represents a unit cell area in which one memory cell is formed. The planer layout of unit cell area A and the planer layout of unit cell area B arranged side by side along the column direction (longitudinal direction in the figure) are in line-symmetry with respect to the boarder line between the two areas. The planer layout of unit cell area A and the planer layout of unit cell area C arranged side by side along the row direction (lateral direction in the figure) are the same. In FIG. 3, only bit lines and word lines are shown, for simplicity of description.

In FIGS. 4 to 9, an area 100 surrounded by dotted lines represents one memory cell area.

Figure 5:
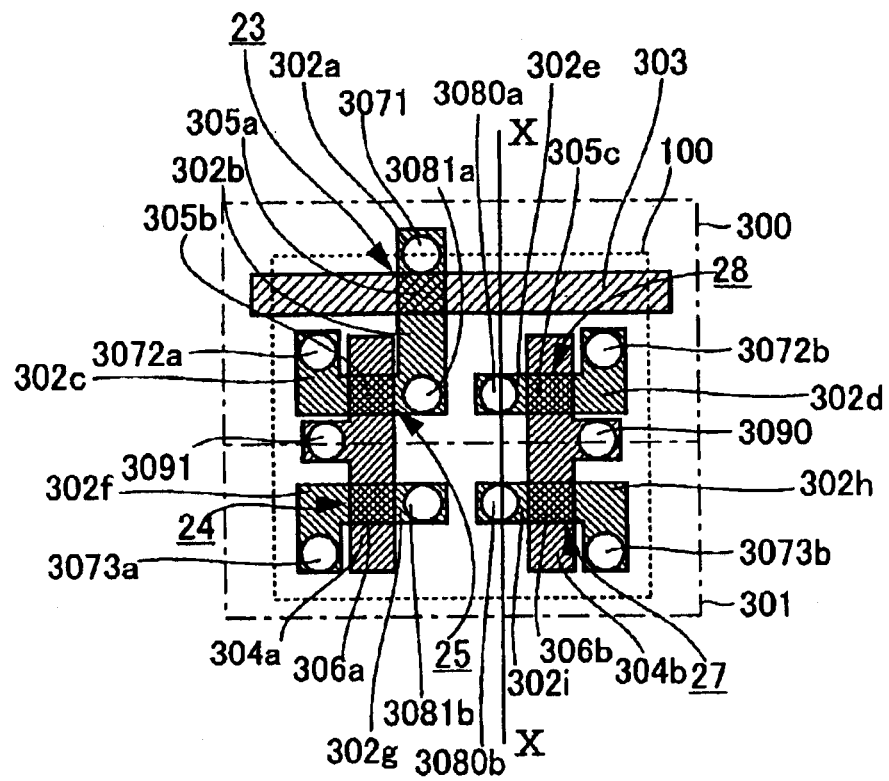
FIGS. 5 to 9 are plan views representing the first to fifth layers from the bottom of the planer layout shown in FIG. 4.
Figure 10:
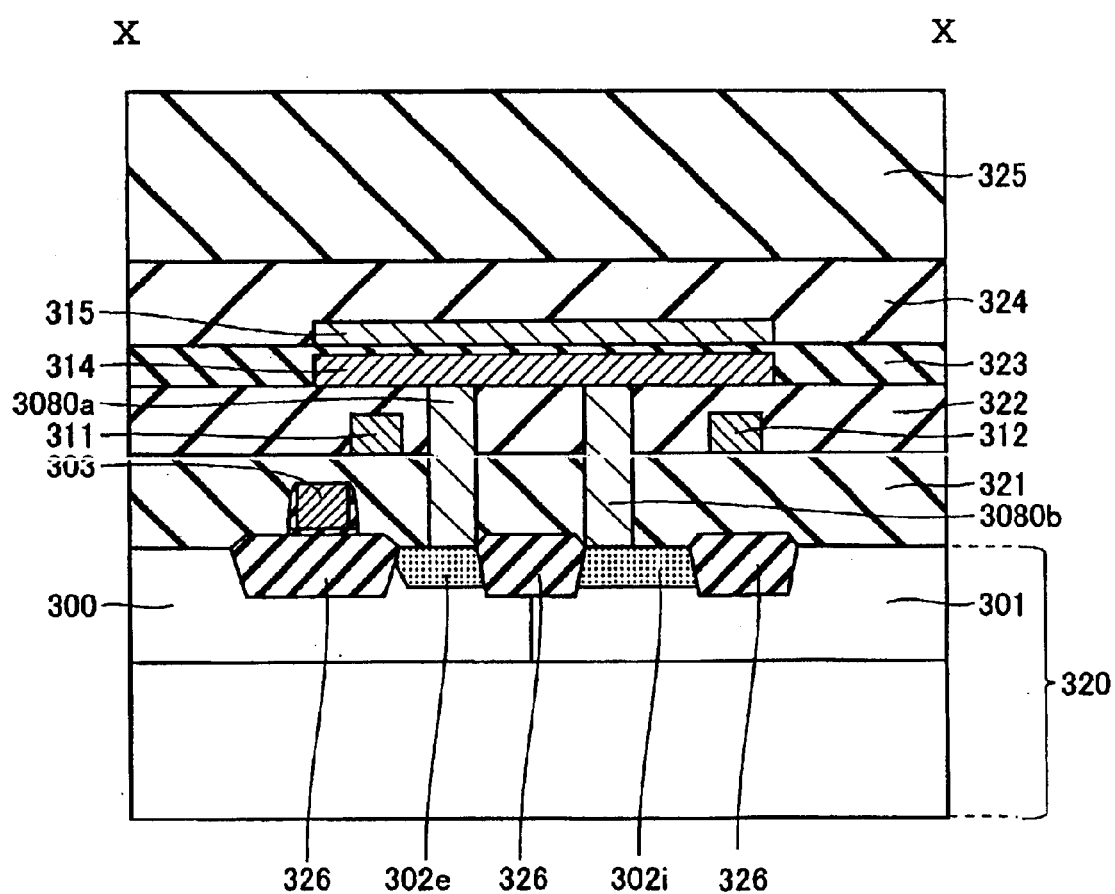
FIG. 10 is a schematic cross section taken along the line X—X of FIG. 4.

Referring to FIGS. 5 and 10, on a surface of a silicon substrate 320, a p well region 300 and an n well region 301 are formed adjacent to each other.

On the surface of silicon substrate 320, a field oxide film 326 for element isolation is formed. In an active region 302 (302a to 302i) on the surface of p well region 300 isolated by field oxide film 326, n-channel MOS transistors 23, 25 and 28 are formed. On the surface of n well region 301 isolated by field oxide film 326, p-channel MOS transistors 24 and 27 are formed.

The n-channel MOS transistor 23 has a pair of source/drain 302a, 302b both formed of n type impurity diffused regions, and a gate 305a formed on the region sandwiched between the pair of source/drain 302a, 302b with a gate insulating layer (not shown) interposed.

The n-channel MOS transistor 25 has a source 302c and a drain 302b both formed of n type impurity diffused regions, and a gate 305b formed in the region sandwiched between source 302c and drain 302b with a gate insulating layer (not shown) interposed.

The n-channel MOS transistor 28 has a source 302d and a drain 302e both formed of n type impurity diffused regions, and a gate 305c formed on the region sandwiched between source 302d and drain 302e with a gate insulating layer (not shown) interposed.

The p-channel MOS transistor 24 has a source 302f and a drain 302g both formed of p type impurity diffused regions, and a gate 306a formed on the region sandwiched between source 302f and drain 302g with a gate insulating layer (not shown) interposed.

The p-channel MOS transistor 27 has a source 302h and a drain 302i both formed of p type impurity diffused regions, and a gate 306b formed on the region sandwiched between source 302h and drain 302i with a gate insulating layer (not shown) interposed.

The gate 305a of n-channel MOS transistor 23 is integrated with word line 303 and traverses the unit cell area in the row direction (lateral direction in FIG. 5). One of source/drain 302b of n-channel MOS transistor 23 and the drain 302b of n-channel MOS transistor 25 are formed of a common impurity diffused region. The gate 305b of n-channel MOS transistor 25 and the gate 306a of p-channel MOS transistor 24 are formed as an inverter gate 304a formed of a common doped polysilicon layer (polycrystalized silicon layer with an impurity introduced). The gate 305c of n-channel MOS transistor 28 and the gate 306b of p-channel MOS transistor 27 are formed as an inverter gate 304b formed of a common doped polysilicon layer.

An interlayer insulating layer 321 is formed on silicon substrate 320 to cover these n-channel MOS transistors 23, 25, 28 and p-channel MOS transistors 24 and 27.

Figure 6:
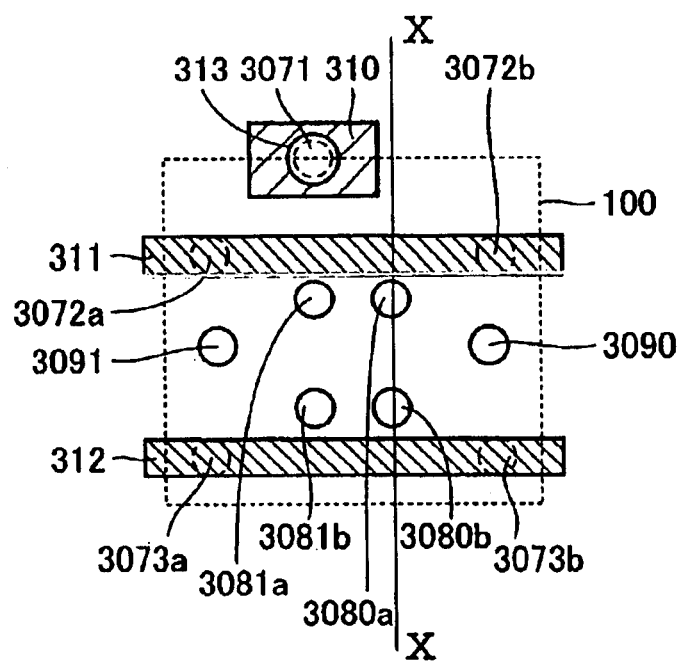

Referring to FIGS. 6 and 10, on interlayer insulating layer 321, a pad 310, a GND line 311 and a Vcc line 312, formed of a metal layer, are formed. The GND line 311 and the Vcc line 312 traverse the unit cell area along the row direction, parallel to each other.

Pad 310 is electrically connected to one of source/drain 302a of n-channel MOS transistor 23 through a contact 3071. The GND line 311 is electrically connected to source 302c of n-channel MOS transistor 25 through a contact 3072a, and electrically connected to source 302d of n-channel MOS transistor 28 through a contact 3072b. The Vcc line 312 is electrically connected to source 302f of p-channel MOS transistor 24 through a contact 3073a, and electrically connected to source 302h of p-channel MOS transistor 27 through a contact 3073b.

An interlayer insulating layer 322 is formed on interlayer insulating layer 321 to cover pad 310, GND line 311 and Vcc line 312.

Figure 7:
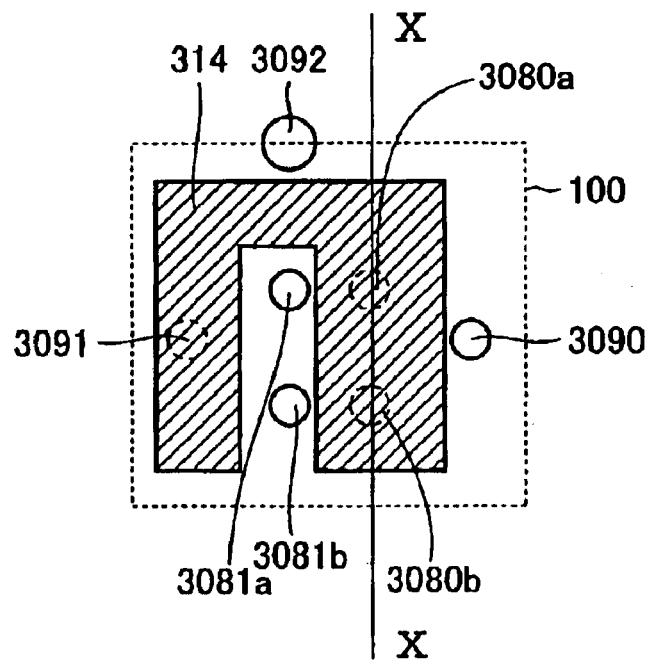

Referring to FIGS. 7 and 10, on interlayer insulating layer 322, a line 314 of doped polysilicon is formed. The line 314 has an inverted U-shaped planer shape, as shown in FIG. 7. The line 314 forms a lower electrode of capacitor 32.

The line 314 is electrically connected to inverter gate 304a through a contact 3091. The line 314 is also electrically connected to drain 302e of n-channel MOS transistor 28 through a contact 3080a, and electrically connected to drain 302i of p-channel MOS transistor 27 through a contact 3080b.

On interlayer insulating layer 322, an interlayer insulating layer 323 is formed to cover the line 314.

Figure 8:
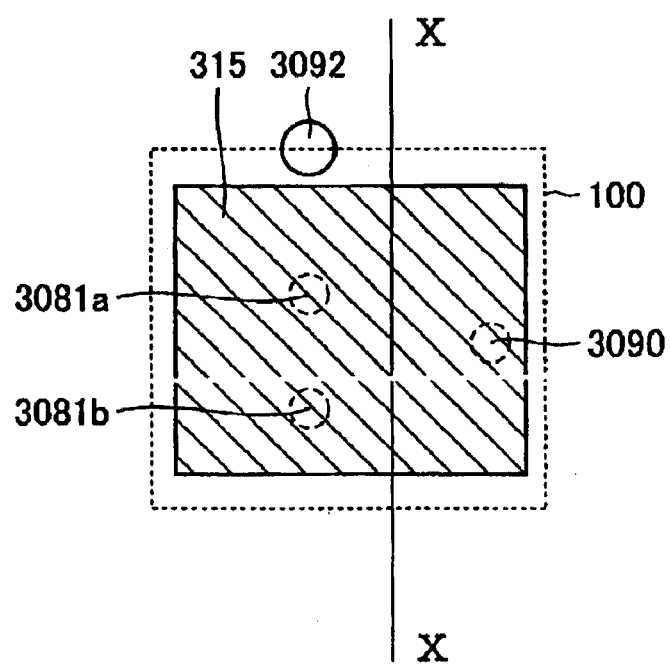

Referring to FIGS. 8 and 10, on interlayer insulating layer 323, a line 315 of a doped polysilicon layer is formed. The line 315 has such a rectangular planer shape that occupies most of the planer region of the unit cell area. The line 315 forms an upper electrode of capacitor 32.

The line 315 is electrically connected to the other one of source/drain 302b of n-channel MOS transistor 23 and the drain 302b of n-channel MOS transistor 25, through contact 3081a, and electrically connected to the drain 302g of p-channel MOS transistor 24 through a contact 3081b. The line 315 is further electrically connected to inverter gate 304b through a contact 3090. As the lines 314 ad 315 must form capacitor 32, the thickness of interlayer insulating layer 323 at a portion sandwiched between the lines 314 and 315 is made thinner than at other portions.

On interlayer insulating layer 323, an interlayer insulating layer 324 is formed to cover the line 315.

Figure 9:
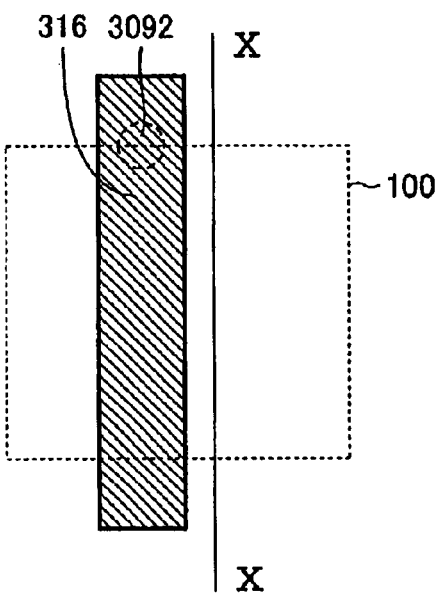

Referring to FIGS. 9 and 10, a bit line 316 of a metal layer is formed on interlayer insulating layer 324. The bit line 316 traverses the unit cell area in the column direction. Bit line 316 is electrically connected to pad 310 through a contact 3092. On interlayer insulating layer 324, an interlayer insulating layer 325 is formed to cover bit line 316.

The operation of memory cell 35 in the first embodiment will be described in the following.

(1) Writing of data "1"

Referring to FIG. 2, when data "1" is to be written to memory cell 35, first, n-channel MOS transistor 23 turns ON, so that the Vcc potential of the bit line is applied to the input node 33 of the first inverter 26. In response, n-channel MOS transistor 25 turns ON and p-channel MOS transistor 24 turns OFF in the first inverter 26. Thus, the output node 34 of the first inverter 26 attains to the ground potential. The ground potential at the output node 34 of the first inverter 26 is applied to the input node 36 of the second inverter 29. In response, in the second inverter, the n-channel MOS transistor 28 turns OFF and p-channel MOS transistor 27 turns ON. Thus, the output node 37 of the second inverter 29 attains to the Vcc potential.

Here, one electrode of capacitor 32 is electrically connected to the output node 37 of the second inverter 29, and the other electrode is electrically connected to the output node 34 of the first inverter 26. Therefore, one electrode of capacitor 32 attains to the Vcc potential, the other electrode attains to the ground potential, and positive charges are stored at the one electrode. This state corresponds to the state in which the data "1" is stored.

(2) Writing of data "0"

Referring to FIG. 2, when data "0" is to be written to memory cell 35, first, n-channel MOS transistor 23 turns ON, whereby the ground potential of the bit line is applied to the input node 33 of the first inverter 26. In response, n-channel MOS transistor 25 turns OFF and p-channel MOS transistor 24 turns ON in the first inverter 26. Thus, the output node 34 of the first inverter 26 attains to the Vcc potential. The Vcc potential of the output node 34 of the first inverter 26 is applied to the input node 36 of the second inverter 29. In response, n-channel MOS transistor 28 turns ON and p-channel MOS transistor 27 turns OFF in the second inverter. Thus, the output node 37 of the second inverter 29 attains to the ground potential.

Here, one electrode of capacitor 32 is electrically connected to the output node 37 of the second inverter 29, and the other electrode is electrically connected to the output node 34 of the first inverter 26. Therefore, one electrode of capacitor 32 attains to the ground potential, and the other electrode attains to the Vcc potential, whereby positive charges are stored at the other electrode. This state corresponds to the state in which data "0" is stored.

(3) Reading of Stored Data

Reading of data stored in memory cell 35 is performed through the similar operation as in a general DRAM. Specifically, the bit line 21 is precharged in advance to the voltage Vcc/2, and at the time of data reading, a boosted power supply voltage is applied to word line 22 to activate word line 22. Consequently, N-channel MOS transistor 23 turns on, slight change in voltage of bit line 21 in accordance with the potential of node 33 (one electrode of capacitor 32) is detected by a sense amplifier, not shown, and the voltage of bit line 21 is amplified to the voltage Vcc or to the ground voltage GND. The voltage level of bit line 21 corresponds to the state of the stored data. Namely, the state of storage is determined based on the capacitance stored in capacitor 32.

In the present embodiment, one electrode of capacitor 32 is electrically connected to output node 37 of the second inverter 29, and the other electrode is electrically connected to output node 34 of the first inverter 26. Therefore, even when charges stored in capacitor 32 are lost by leakage current, charges can be compensated for by the first and second inverters 26 and 29 cross coupled to each other. Thus, in capacitor 32, a prescribed amount of charges are maintained constantly, and hence refresh operation becomes unnecessary.

In the present embodiment, one electrode of capacitor 32 is electrically connected to output node 37 of the second inverter 29 and the other electrode is electrically connected to output node 34 of the first inverter 26. Therefore, it is unnecessary to connect each of the one and the other electrodes of capacitor 32 to the cell plate potential. Therefore, even when charges generated by a soft error happen to concentrate on one of the output nodes 37 and 34, the potential at the other node follows the change by capacitive coupling, as there is the capacitor 32 between output nodes 37 and 34. As a result, potential difference between output nodes 37 and 34 can be maintained, and therefore, a structure is realized which is strong against destruction of stored data caused by soft error phenomenon. Further, in the present embodiment, inverters 26 and 29 can be formed in a simple structure of one p type transistor and one n type transistor. Further, as capacitor 32 is formed above n-channel MOS transistor 23, capacitor 32 having large surface area can be formed.

Second Embodiment

Figure 11:
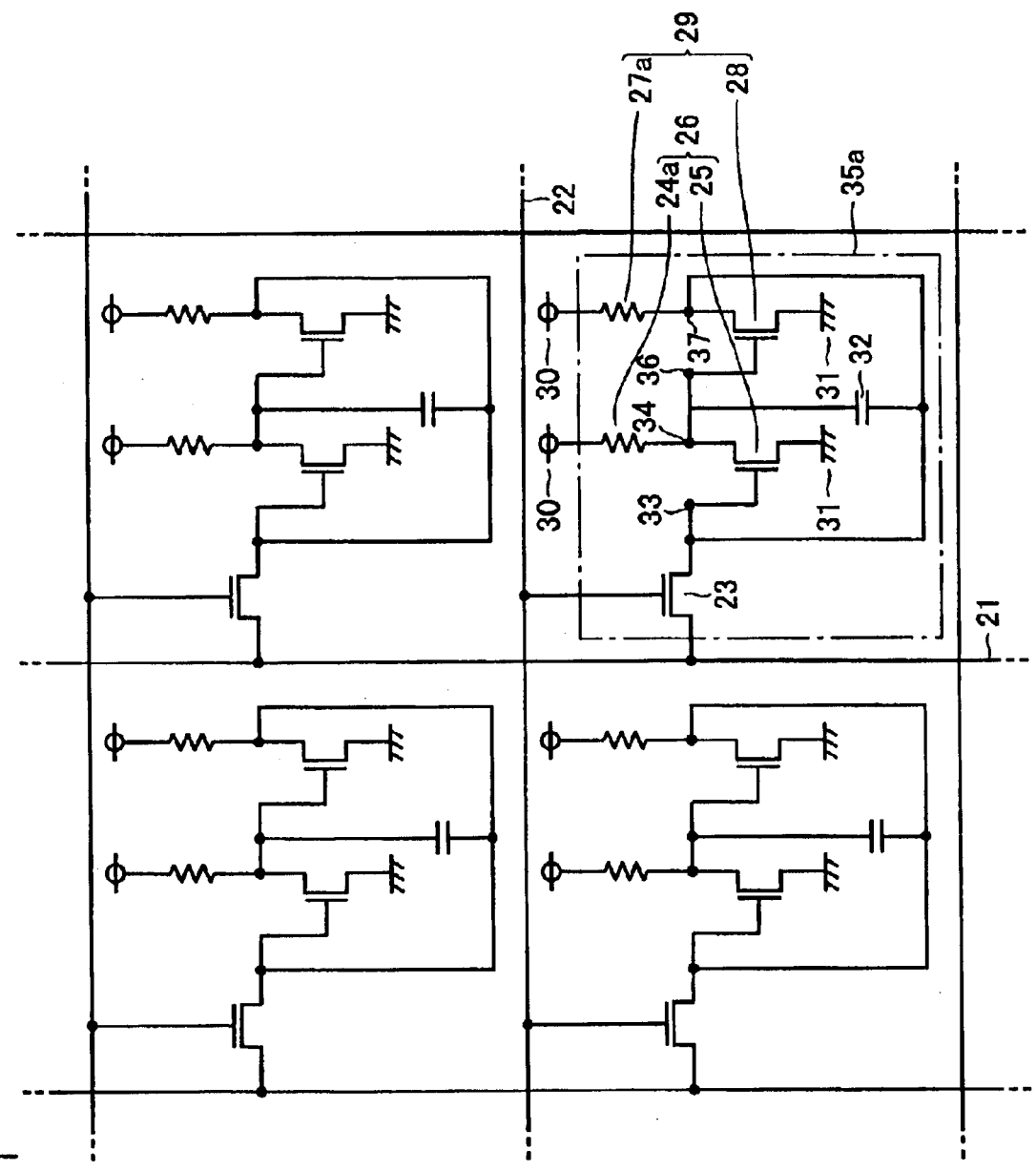
FIG. 11 is a circuit diagram representing a configuration of memory cells arranged in a memory cell array in the semiconductor memory device in accordance with the second embodiment of the present invention.

Referring to FIG. 11, a memory cell 35a in accordance with the present embodiment employs, in place of p-channel MOS transistors 24 and 27 of memory cell 35 of the first embodiment shown in FIG. 2, resistor elements 24a and 27a. Resistor element 24a has one end connected to a power supply node 30 and the other end connected to a node 34. Resistor element 27a has one end connected to power supply node 30 and the other end connected to node 37. Except for resistor elements 24a and 27a, the configuration of memory cell 35a is the same as that of memory cell 35, and therefore, description thereof will not be repeated.

Specific structures of the memory cell array and memory cell in accordance with the second embodiment will be described in the following.

Figure 12:
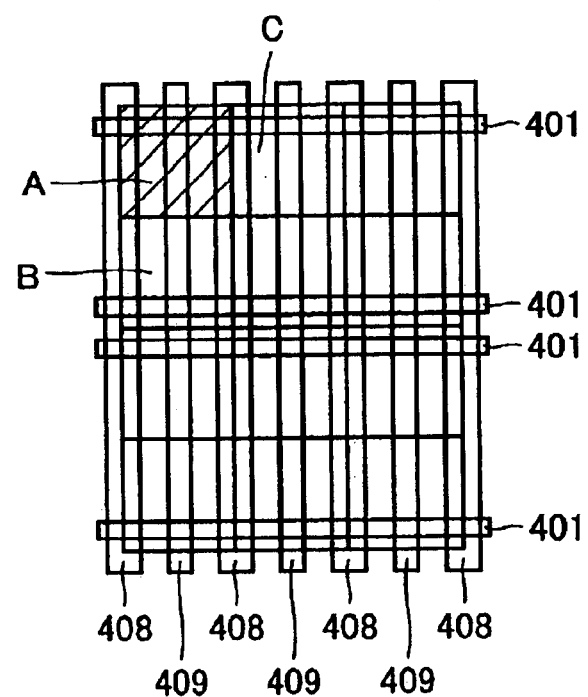
FIG. 12 is a schematic plan view showing a part of the structure of a DRAM memory cell array in accordance with the second embodiment of the present invention.
Figure 13:
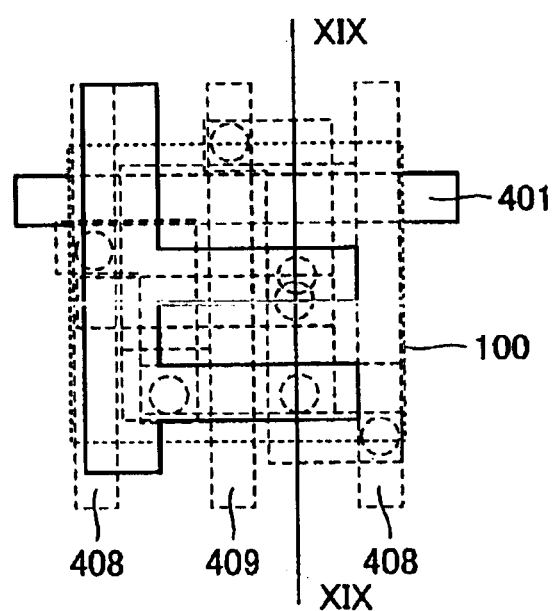
FIG. 13 is a plan view representing a planer layout of unit cell areas A and C shown in FIG. 12.

Referring to FIG. 12, in the memory cell array, a plurality of bit lines 409 and a plurality of GND lines 408 are formed, each orthogonally crossing each of a plurality of word lines 401. At each intersecting portion between word line 401 and bit line 409, a memory cell is arranged. The hatched portion represents a unit cell area A in which one memory cell is formed. GND line 408 is provided at a boundary of each memory cell, and adjacent memory cells share the GND line 408. The planer layout of unit cell area A and the planer layout of unit cell area B arranged side by side along the column direction (longitudinal direction in the figure) are made in line-symmetry with respect to the boarder line between the two areas. Unit cell areas A and C arranged side by side along the row direction (lateral direction in the figure) have the same planer layout. In FIG. 12, only the bits line, word line and GND line are shown, for simplicity of description.

In FIGS. 13 to 18, the area 100 surrounded by dotted lines represent one memory cell area.

Figure 14:
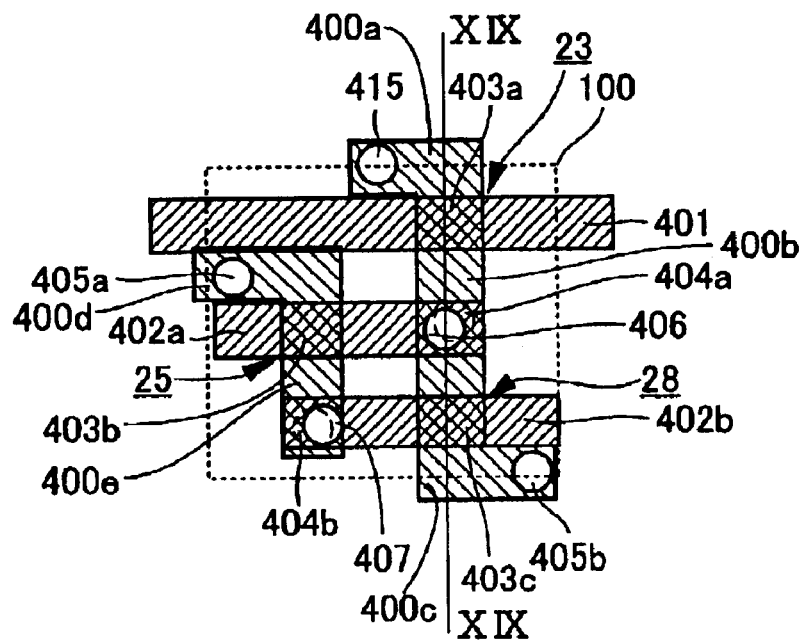
FIGS. 14 to 18 are plan views showing the first to fifth layers from the bottom of the planer layout shown in FIG. 13.
Figure 19:
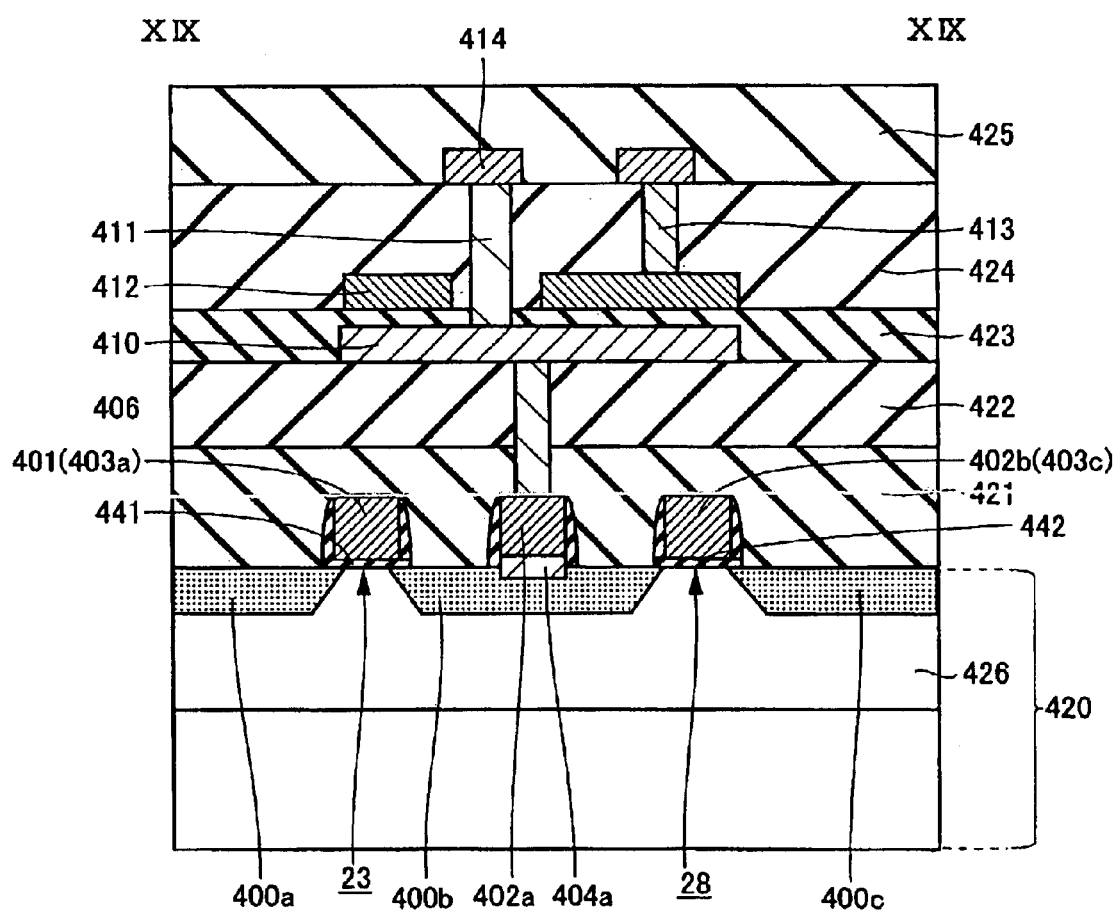
FIG. 19 is a schematic cross section taken along the line XIX—XIX of FIG. 19.

Referring to FIGS. 14 and 19, on a surface of a silicon substrate 420, a p well region 426 is formed.

On the surface of silicon substrate 420, a field oxide film for element isolation is formed. In an active region 400 (400a to 400e) at the surface of p well region 426 isolated by the field oxide film, n-channel MOS transistors 23, 25 and 28 are formed.

The n-channel MOS transistor 23 has a pair of source/drain 400a, 400b both formed of n type impurity diffused regions, and a gate 403a formed on the region sandwiched between the pair of source/drain 400a, 400b with a gate insulating layer 441 interposed.

The n-channel MOS transistor 25 has a source 400d and a drain 400e both formed of n type impurity diffused regions, and a gate 403b formed on the region sandwiched between source 400d and drain 400e with a gate insulating layer (not shown) interposed.

The n-channel MOS transistor 28 has a source 400c and a drain 400b both formed of n type impurity diffused regions, and a gate 403c formed on the region sandwiched between source 400c and drain 400b with a gate insulating layer 442 interposed.

The gate 403a of n-channel MOS transistor 23 is integrated with word line 401, and traverses the unit cell area in the row direction (lateral direction in FIG. 14). One of source/drain 400b of n-channel MOS transistor 23 and drain 400b of n-channel MOS transistor 28 are formed of a common impurity diffused region.

Inverter gate 402a integrated with gate 403b of n-channel MOS transistor 25 is electrically connected to the one of source/drain 400b of n-channel MOS transistor 23 and to the drain 400b of n-channel MOS transistor 28, through a contact 400a. Inverter gate 402b integrated with gate 403c of n-channel MOS transistor 28 is electrically connected to the drain 400e of n-channel MOS transistor 25 through a contact 404b.

On silicon substrate 402, interlayer insulating layer 421 is formed to cover the n-channel MOS transistors 23, 25 and 28.

Figure 15:
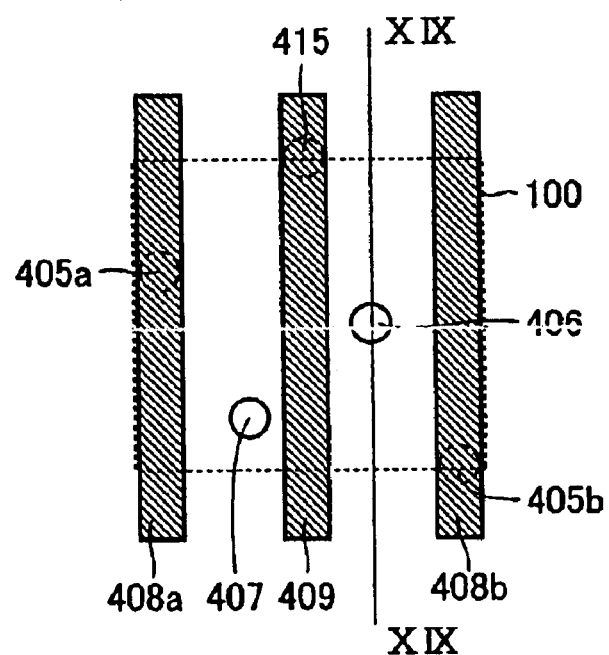

Referring to FIGS. 15 and 19, on interlayer insulating layer 421, a bit line 409 and two GND lines 408a, 408b, formed of a metal layer, are formed. Bit line 409 and two GND lines 408a and 408b traverse the unit cell area in the column direction, parallel to each other.

One GND line 408a is electrically connected to source 400d of n-channel MOS transistor 25 through a contact 405a, and the other GND line 408b is electrically connected to source 400c of n-channel MOS transistor 28 through a contact 405b. Bit line 409 is electrically connected to one 400a of source/drain of n-channel MOS transistor 23 through a contact 415.

On interlayer insulating layer 421, an interlayer insulating layer 422 is formed to cover the bit line 409 and the two GND lines 408a and 408b.

Figure 16:
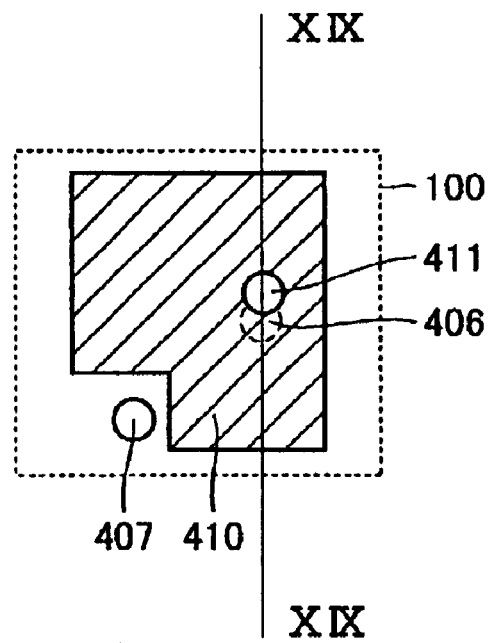

Referring to FIGS. 16 and 19, on interlayer insulating layer 422, a line 410 of doped polysilicon layer is formed. The line 410 is formed to occupy most of the planer area of the unit cell area. The line 410 constitutes the lower electrode of capacitor 32 in memory cell 35a. The line 410 is electrically connected to inverter gate 402a through a contact 406.

On interlayer insulating layer 422, an interlayer insulating layer 423 is formed to cover line 410.

Figure 17:
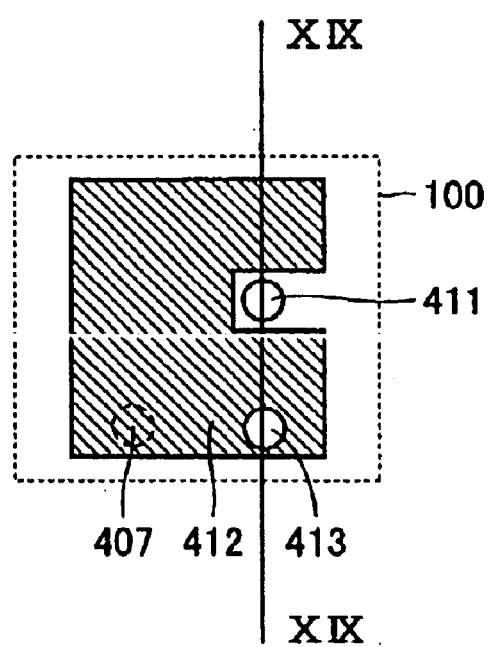

Referring to FIGS. 17 and 19, on interlayer insulating layer 423, a line 412 of doped polysilicon layer is formed. The line 412 is formed to occupy most of the planer area of the unit cell area. The line 412 forms the upper electrode of capacitor 32.

The line 412 is electrically connected to inverter gate 402b that has gate 403c of n-channel MOS transistor 28 through a contact 407. As lines 410 and 412 must form capacitor 32, thickness of interlayer insulating layer 423 at the portion sandwiched between lines 410 and 412 is made thinner than at other portions.

On interlayer insulating layer 423, an interlayer insulating layer 424 is formed to cover the line 412.

Figure 18:
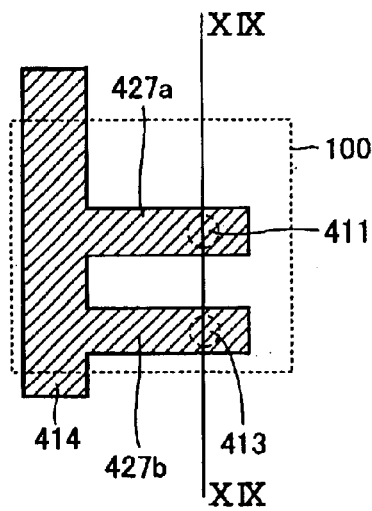

Referring to FIGS. 18 and 19, on interlayer insulating layer 424, a Vcc line 414 of a polysilicon layer of high resistance is formed, and this portion provides resistor elements 24a and 27a. The Vcc line 414 traverses the unit cell area along the column direction, and two bar-shaped portions 427a and 427b branch and extend along the row direction. The bar-shaped portion 427a is electrically connected to the line 410 through a contact 411. The bar-shaped portion 427b is electrically connected to the line 412 through a contact 413. On interlayer insulating layer 424, an interlayer insulating layer 425 is formed to cover the Vcc line 414.

Operation of memory 35a in accordance with the second embodiment will be described in the following.

(1) Writing of data "1"

Referring to FIG. 11, when data "1" is to be written to memory cell 35a, first, n-channel MOS transistor 23 turns ON, and the Vcc potential of the bit line is applied to input node 33 of the first inverter 26. In response, n-channel MOS transistor 25 turns ON in the first inverter 26, and the potential of output node 34 of the first inverter 26 attains to the ground potential. The ground potential of output node 34 of the first inverter 26 is applied to input node 36 of the second inverter 29. In response, n-channel MOS transistor 28 turns OFF in the second inverter 29, and output node 37 of the second inverter 29 is charged through resistor element 27a by power supply node 30 to the Vcc potential.

Here, one electrode of capacitor 32 is electrically connected to output node 37 of the second inverter 29, and the other electrode is electrically connected to output node 34 of the first inverter 26. Therefore, one electrode of capacitor 32 attains to Vcc and the other electrode attains to the ground potential, whereby positive charges are stored at the one electrode. This state corresponds to the state in which data "1" is stored.

(2) Writing of data "0"

Referring to FIG. 11, when data "0" is to be written to memory cell 35a, first, n-channel MOS transistor 23 turns ON, and the ground potential of the bit line is applied to input node 33 of the first inverter 26. In response, n-channel MOS transistor 25 turns OFF in the first inverter 26, whereby output node 34 of the first inverter 26 is charged through resistor element 24a by power supply node 30 to the Vcc potential. The Vcc potential of output node 34 of the first inverter 26 is applied to input node 36 of the second inverter 29. In response, n-channel MOS transistor 28 turns ON in the second inverter 29, and the potential of output node 37 of the second inverter 29 attains to the ground potential.

Here, one electrode of capacitor 32 is electrically connected to output node 37 of the second inverter 29, and the other electrode is electrically connected to output node 34 of the first inverter 26. Therefore, one electrode of capacitor 32 attains to the ground potential, and the other electrode attains to Vcc, whereby positive charges are stored at the other electrode. This state corresponds to the state in which data "0" is stored.

(3) Reading of Stored Data

The data stored in memory 35a can be read through the same operation as described in the first embodiment. Therefore, description thereof will not be repeated.

In the present embodiment, resistor elements 24a and 27a are used in place of p-channel MOS transistors 24 and 27 in the configurations of inverters 26 and 29. Therefore, when the memory cell is formed, only the p well region must be formed at the surface of silicon substrate 420. Therefore, in addition to the effects attained by the first embodiment, planer area of occupation of the memory cell can further be reduced. Further, as capacitor 32 is formed between resistor elements 24a and 27a and n-channel MOS transistor 23, the electrode of capacitor 32 is directly connected to n-channel MOS transistor 23 electrically, not through resistor elements 24a and 27a. Therefore, influence of resistor elements 24a and 27a on capacitor 32 can be prevented.

Third Embodiment

Figure 20:
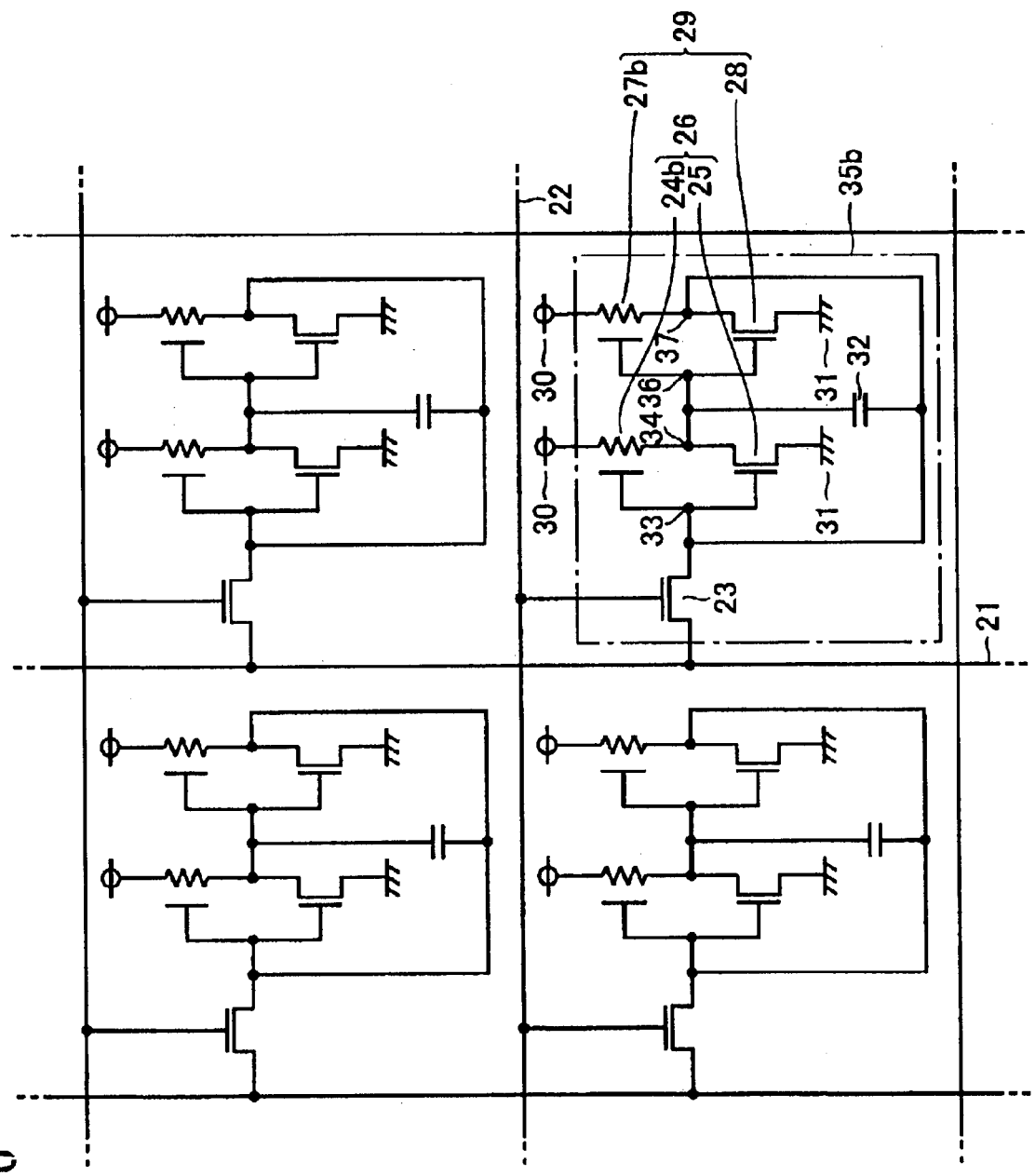
FIG. 20 is a circuit diagram representing a configuration of memory cells arranged in a memory cell array of the semiconductor memory device in accordance with the third embodiment of the present invention.

In the configuration of memory cell 35b shown in FIG. 20, in place of p-channel MOS transistors 24 and 27 of memory cell 35 shown in FIG. 2 in accordance with the first embodiment, p-channel thin film transistors 24b and 27b are used. Except for p-channel thin film transistors 24b and 27b, the configuration of memory cell 35b is the same as that of memory cell 35, and therefore, corresponding portions are denoted by the same reference characters and description thereof will not be repeated.

The specific configuration of the memory cell array and memory cell in accordance with the third embodiment will be described in the following.

Figure 21:
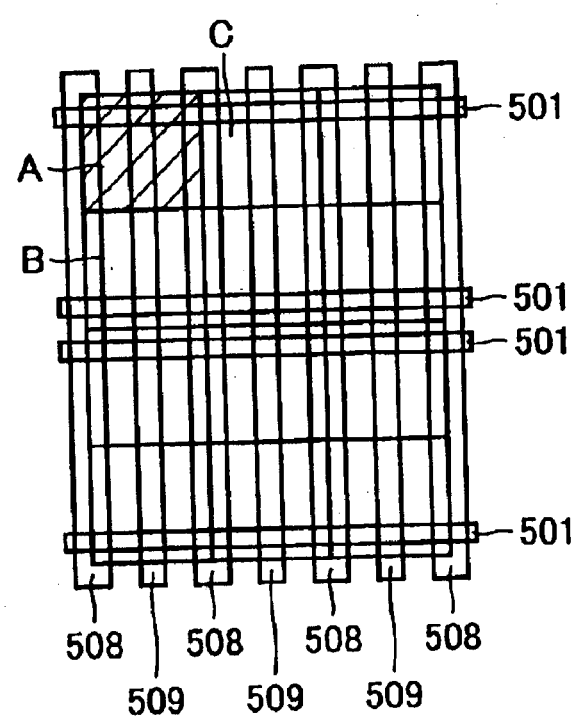
FIG. 21 is a schematic plan view representing a part of the structure of the DRAM memory cell array in accordance with the third embodiment of the present invention.
Figure 22:
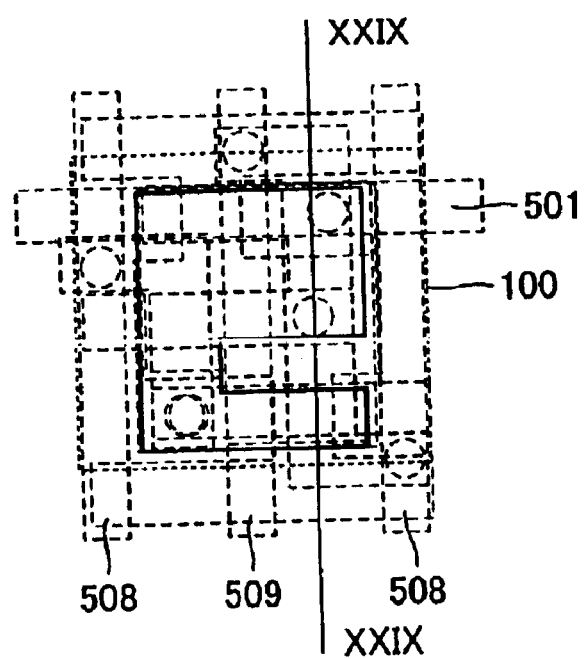
FIG. 22 is a plan view representing a planer layout of unit cell areas A and C of FIG. 21.

Referring to FIG. 21, in the memory cell array, a plurality of bit lines 509 and a plurality of GND lines 508 are formed, each orthogonally crossing each of a plurality of word lines 501. At each intersecting portion between word line 501 and bit line 509, a memory cell is arranged, and a hatched portion represents a unit cell area in which one memory cell is formed. GND line 508 is provided at the boundary of each memory cell, and adjacent memory cells share GND line 508. The planer layout of unit cell area A and planer layout of unit cell area B arranged side by side along the column direction (longitudinal direction in the figure) are in line symmetry with respect to the boundary line between the areas. The planer layout of unit cell area A and planer layout of unit cell area C arranged side by side along the row direction (lateral direction in the figure) are the same. In FIG. 21, only the bit line, word line and GND line are shown, for simplicity of description. In FIGS. 23 to 28, the area 100 surrounded by dotted lines represents one memory cell area.

Figure 23:
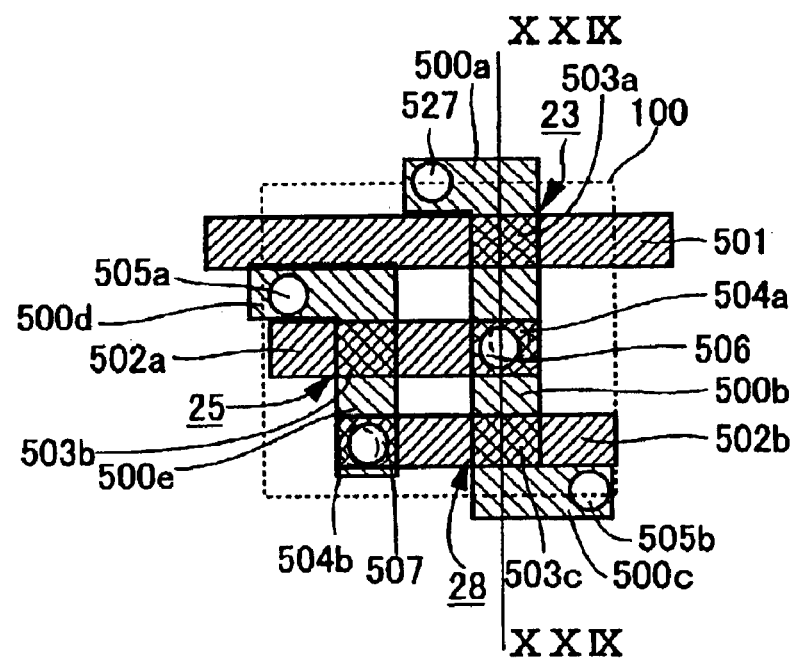
FIGS. 23 to 28 are plan views representing the first to sixth layers from the bottom of the planer layout shown in FIG. 21.
Figure 29:
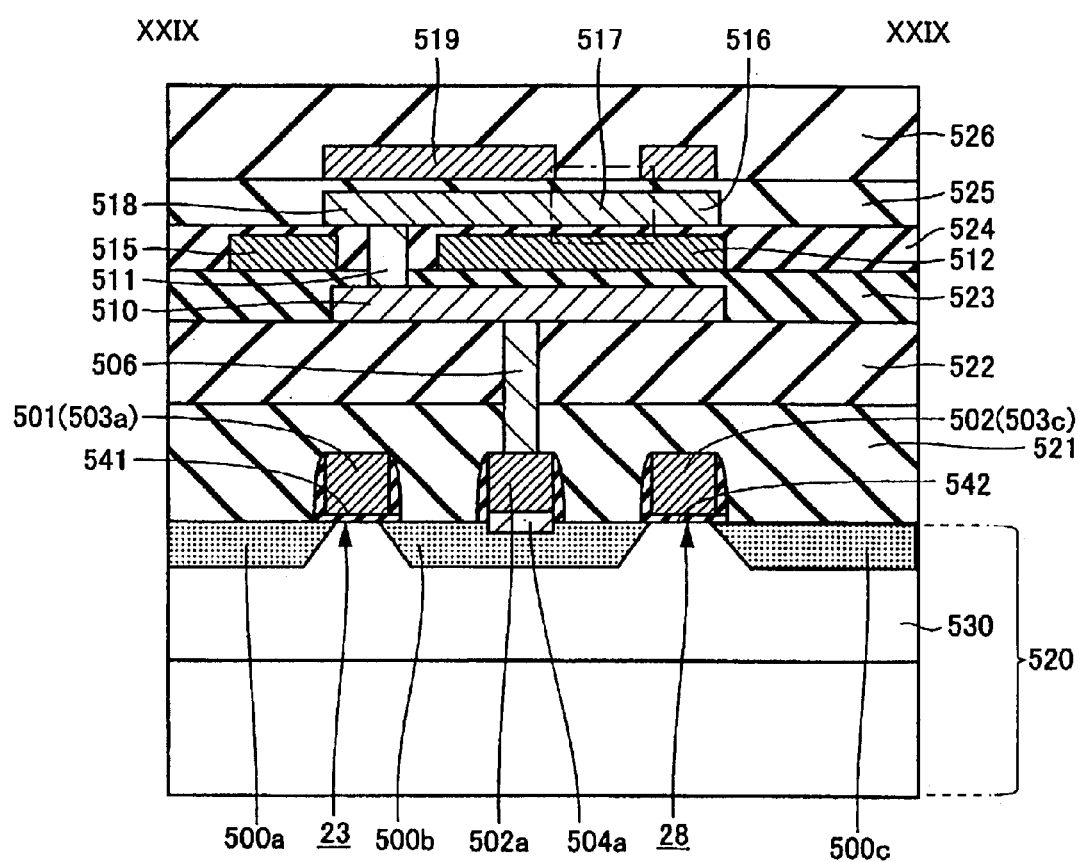
FIG. 29 is a schematic cross section taken along the line XXIX—XXIX of FIG. 22.
Figure 30:
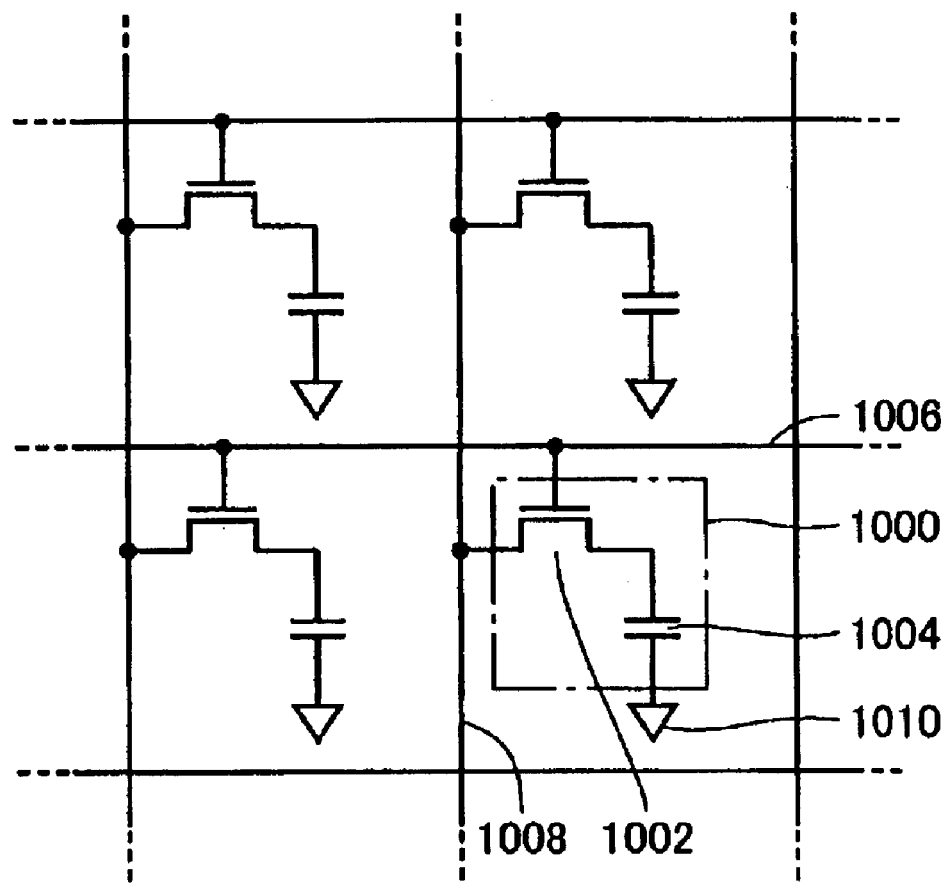
FIG. 30 is a circuit diagram representing a structure of memory cells arranged in a matrix of rows and columns in a memory cell array of a DRAM.

Referring to FIGS. 23 and 29, on a surface of a silicon substrate 520, a p well region 530 is formed.

On the surface of silicon substrate 520, a field oxide film for element isolation is formed. In an active region 500 (500a to 500e) at the surface of p well region 530 isolated by the field oxide film, n-channel MOS transistors 23, 25 and 28 are formed.

The n-channel MOS transistor 23 has a pair of source/drain 500a, 500b both formed of n type impurity diffused regions, and a gate 503a formed on the region sandwiched between the pair of source/drain 500a, 500b with a gate insulating layer 541 interposed.

The n-channel MOS transistor 25 has a source 500d and a drain 500e both formed of n type impurity diffused regions, and a gate 503b formed on the region sandwiched between source 500d and drain 500e with a gate insulating layer (not shown) interposed.

The n-channel MOS transistor 28 has a source 500c and a drain 500b both formed of n type impurity diffused regions, and a gate 503c formed on the region sandwiched between source 500c and drain 500b with a gate insulating layer 542 interposed.

The gate 503a of n-channel MOS transistor 23 is integrated with word line 501, and traverses the unit cell area in the row direction (lateral direction in FIG. 23). One of source/drain 500b of n-channel MOS transistor 23 and the drain 500b of n-channel MOS transistor 28 are formed of a common impurity diffused region.

Inverter gate 502a having gate 503b of n-channel MOS transistor 25 is electrically connected to one of source/drain 400b of n-channel MOS transistor 23 and to the drain 500b of n-channel MOS transistor 28, through a contact 504a. Inverter gate 502b having gate 503c of n-channel MOS transistor 28 is electrically connected to the drain 500e of n-channel MOS transistor 25 through a contact 504b.

On silicon substrate 520, interlayer insulating layer 521 is formed to cover these n-channel MOS transistors 23, 25 and 28.

Figure 24:
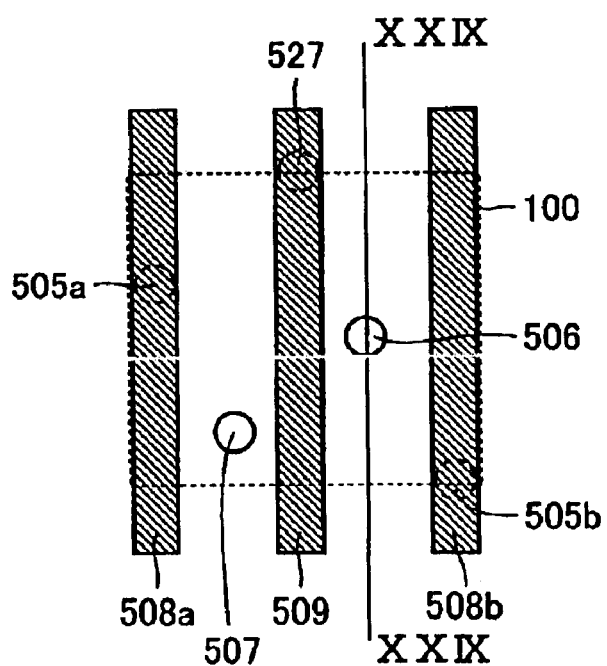

Referring to FIGS. 24 and 29, a bit line 509 and two GND lines 508a and 508b, formed of metal, are formed on interlayer insulating layer 521. Bit line 509 and two GND lines 508a and 508b traverse the unit cell area along the column direction, parallel to each other.

One GND line 508a is electrically connected to source 500d of n-channel MOS transistor 25 through a contact 505a, and the other GND line 508b is electrically connected to source 500c of n-channel MOS transistor 28 through a contact 505b. Bit line 509 is electrically connected to one of source/drain 500a of n-channel MOS transistor 23 through a contact 527.

On interlayer insulating layer 521, an interlayer insulating layer 522 is formed to cover bit line 509 and the two GND lines 508a and 508b.

Figure 25:
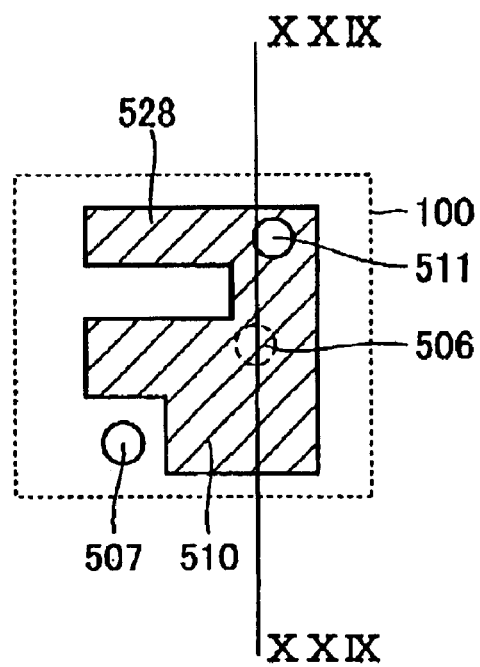

Referring to FIGS. 25 and 29, a line 510 of doped polysilicon layer is formed on interlayer insulating layer 522. The line 510 forms the lower electrode of capacitor 32 in memory cell 35b, together with a line 518, which will be described later. Of line 510, a bar-shaped protruding portion 528 is a gate of p-channel thin film transistor 24b.

The line 510 is electrically connected to inverter gate 502a having gate 503b of n-channel MOS transistor 25 through a contact 506.

On interlayer insulating layer 522, an interlayer insulating layer 523 is formed to cover line 510.

Figure 26:
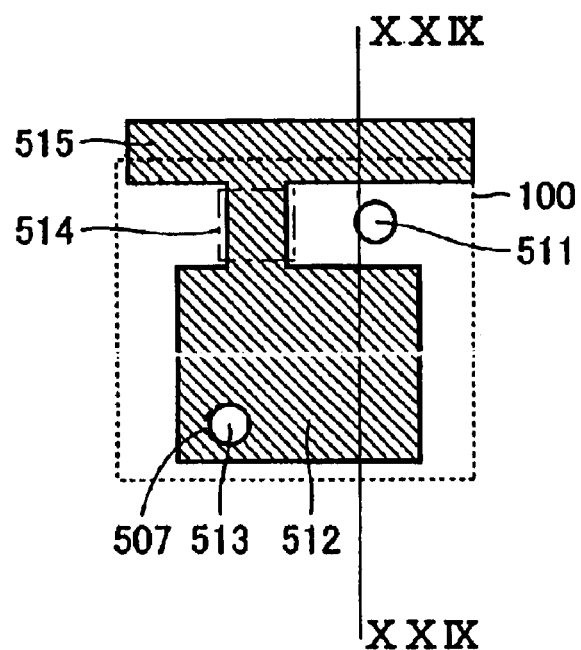

Referring to FIGS. 26 and 29, on interlayer insulating layer 523, a line 512 of doped polysilicon layer is formed. The line 512 forms an upper electrode of capacitor 32 in memory cell 35b, together with a line 519, which will be described later. Of line 512, a bar-shaped portion 515 is a source of p-channel thin film transistor 24b, and the Vcc potential is applied to the source 515. A portion 514 connecting the bar-shaped portion 515 to a rectangle of large area is a channel region of p-channel thin film transistor 24b.

Line 512 is electrically connected to inverter gate 502b through contact 507. As lines 510 and 512 must form capacitor 32, thickness of interlayer insulating layer 523 at the portion sandwiched between lines 510 and 512 is made thinner than at other portions.

On interlayer insulating layer 523, an interlayer insulating layer 524 is formed to cover line 512.

Figure 27:
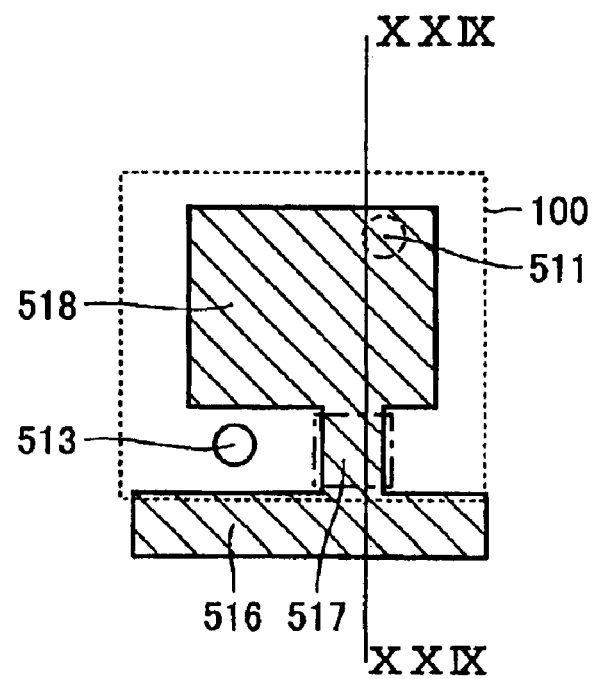

Referring to FIGS. 27 and 29, a line 518 of polysilicon layer is formed on interlayer insulating layer 524. Line 518 forms the lower electrode of capacitor 32 in memory cell 35b together with line 510 described above. Of line 518, bar-shaped portion 516 is the source of p-channel thin film transistor 27b, and the potential Vcc is applied to source 516. A portion 517 connecting bar-shaped portion 516 to a rectangular portion of large area is a channel region of p-channel thin film transistor 27b.

Line 518 is electrically connected to line 510 through a contact 511. As lines 512 and 518 must form capacitor 32, thickness of interlayer insulating layer 524 at a portion sandwiched between lines 512 and 518 is made thinner than at other portions.

On interlayer insulating layer 524, an interlayer insulating layer 525 is formed to cover line 518.

Figure 28:
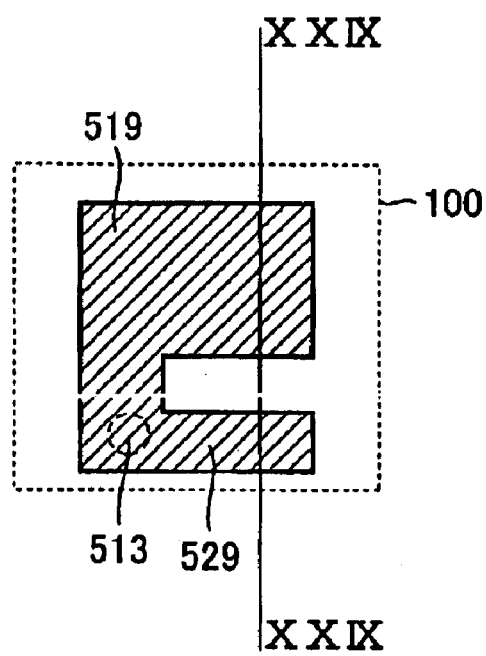

Referring to FIGS. 28 and 29, on interlayer insulating layer 525, a line 519 of polysilicon layer is formed. Line 519 forms the upper electrode of capacitor 32 in memory cell 35b together with the line 512 described above. Of line 519, a bar-shaped protruded portion 529 is the gate of p-channel thin film transistor 27b.

Line 519 is electrically connected to line 512 through a contact 513. As lines 518 and 519 must form capacitor 32, thickness of interlayer insulating layer 525 at the portion sandwiched between lines 518 and 519 is made thinner than at other portions. On interlayer insulating layer 525, an interlayer insulating layer 526 is formed to cover Vcc line 512.

The operation of memory cell 35b of the present embodiment is the same as that of memory cell 35 in accordance with the first embodiment, and therefore, description thereof will not be repeated.

In the present embodiment, p-channel thin film transistors 24b and 27b of multi-stacked layers are used in place of p-channel MOS transistors 24 and 27 in the configurations of inverters 26 and 29. Therefore, by the multi-stacked layers of p-channel thin film transistors, a parallel plate type stacked capacitor is formed. Thus, it becomes unnecessary to separately form the capacitor element, and planer area of occupation of the memory cell can further be reduced by the area of the capacitor element.

Though transfer transistors in the first to third embodiments are n-channel MOS transistors, the transistors are not limited thereto, and transistors of different type may be used.

Further, though resistor element in the second embodiment was formed of a polysilicon layer, it is not limited thereto and other types of material may be used.

Preferably, in the semiconductor memory device of the present invention, each of the first and second inverters is constituted by first and second transistors of opposite conductivity types, and their capacitor element is formed above the transfer gate transistor. Therefore, the transistors in each inverter can be implemented by a p type transistor compensating for the leakage of charges from the capacitor element when data is held, and an n type transistor holding the low level storage node at the GND level. Therefore, the inverters can be formed in a simple configuration with transistors of minimum size in accordance with the process rule, and planer area of occupation of the memory cell can be reduced. Further, as the capacitor element is formed above the transfer gate transistor, it is possible to form electrodes of capacitor element having large surface area.

Preferably, in the semiconductor memory device of the present invention, the first transistor in each of the first and second inverters is a thin film transistor. As the thin film transistor can be formed on an upper layer of a bulk transistor formed on the surface of the substrate, the space in the lateral direction of the memory cell can be saved as compared with the bulk transistor arranged laterally, and hence planer area of occupation of the memory cell can further be reduced. Further, when each first transistor is formed as a thin film transistor, one of two conductive well regions can be omitted, and only a single well region in the memory cell is sufficient. Therefore, planer area of occupation of the memory cell can further be reduced.

Preferably, in the semiconductor memory device of the present invention, the capacitor element is formed by stacking the first transistor of the first inverter and the first transistor of the second inverter. By this structure, a parallel plate type stacked capacitor is formed by multi stacked layers of thin film transistors. Therefore, it becomes unnecessary to form the capacitor element separately from the thin film transistors.

Preferably, in the semiconductor memory device of the present invention, each of the first and second inverters is constituted by a resistor element and a transistor, and the capacitor element is formed between the resistor element and a transfer gate transistor. When a memory cell is formed and the first and second transistors of opposite conductivity types are to be formed on the substrate, it is necessary to provide two conductive wells in the substrate. As a resistor element is used in place of the transistor of one conductivity type, one of the two conductive well regions can be omitted, and only a single well region have to be formed in the memory cell. Therefore, planer area of occupation of the memory cell can further be reduced. In addition, as the capacitor element is formed between the resistor element and transfer gate transistor, the electrode forming the capacitance is electrically connected to the transfer gate transistor not through the resistor element. Therefore, influence of the resistor element on the electrode forming the capacitance can be prevented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device including a plurality of memory cells arranged in a matrix of rows and columns, wherein each of said plurality of memory cells includes
only one transfer gate transistor having a pair of source/drain,
a first inverter having an input node electrically connected to one of said pair of source/drain,
a second inverter having an output node electrically connected to said input node of said first inverter and an input node electrically connected to an output node of said first inverter, and
a capacitor element having first and second electrodes opposing each other to allow storage of charge, said first electrode being electrically connected to said one of said pair of source/drain and said output node of said second inverter, said second electrode being electrically connected to said output node of said first inverter, said semiconductor memory device having
a plurality of bit lines provided for the respective columns of the memory cells, each of said bit lines electrically connected to the other of said pair of source/drain of each memory cell of each column, and
a plurality of word lines provided for the respective rows of the memory cells, each of said word lines electrically connected to a gate of said transfer gate transistor of each memory cell of each row, wherein data of said memory cell is read based on charge stored in said capacitance element.

2. The semiconductor memory device according to claim 1, wherein
said first inverter and said second inverter are each formed of a first transistor and a second transistor of opposite conductivity types, and said capacitor element is formed above said transfer gate transistor.

3. The semiconductor memory device according to claim 2, wherein
said first transistor of each of said first inverter and said second inverter is a thin film transistor.

4. The semiconductor memory device according to claim 3, wherein
said capacitor element is formed by stacking, in multilayer, said first transistor of said first inverter and said first transistor of said second inverter.

5. The semiconductor memory device according to claim 1, wherein
said first inverter and said second inverter are each constituted by a resistor element and a transistor and said capacitor element is formed between said resistor element and said transfer gate transistor.

6. The semiconductor memory device according to claim 1, wherein
an operation of reading said data is performed by pre-charging a potential on said bit line to a predetermined potential and applying a boost voltage to said word line.

7. The semiconductor memory device according to claim 1, wherein
an operation of writing said data is performed by driving a potential on said bit line to a power supply voltage or a ground potential in accordance with write data and activating said word line.

* * * * *